United States Patent [19]

Gauthier et al.

[11] Patent Number: 5,116,665
[45] Date of Patent: May 26, 1992

[54] MULTILAYER PROTECTIVE COATING FOR A SUBSTRATE, PROCESS FOR PROTECTING A SUBSTRATE BY A PLASMA DEPOSITION OF SUCH A COATING, COATINGS OBTAINED AND APPLICATIONS THEREOF

[75] Inventors: Jean-Marie Gauthier, Palaiseau; Francois Coeuret, Guyancourt; Claude Bonet, Paris, all of France

[73] Assignee: L'Air Liquide, Societe Anonyme Pour L'Etude et L'Exploitation des Procedes Georges Claude, Paris, France

[21] Appl. No.: 351,942

[22] Filed: May 11, 1989

[30] Foreign Application Priority Data

May 11, 1988 [FR] France .................................. 8806369

[51] Int. Cl.$^5$ .............................................. B32B 7/02
[52] U.S. Cl. .................................... 428/216; 428/212; 428/336; 428/412; 428/446; 428/447; 428/698; 428/702; 428/704
[58] Field of Search ............... 428/446, 698, 702, 704, 428/336, 212, 216, 412, 447; 252/501.1; 430/65, 57, 58

[56] References Cited

U.S. PATENT DOCUMENTS

| | | | |
|---|---|---|---|
| 4,239,819 | 12/1980 | Holzl | 428/457 |
| 4,289,822 | 9/1981 | Shimada et al. | 428/212 |
| 4,443,529 | 4/1984 | Kanba et al. | 430/65 |
| 4,460,669 | 7/1984 | Ogawa et al. | 252/59.1 |
| 4,485,146 | 11/1984 | Mizuhashi et al. | 428/446 |
| 4,486,521 | 12/1984 | Misumi et al. | 430/65 |
| 4,489,149 | 12/1984 | Kawamura et al. | 252/501.1 |
| 4,490,454 | 12/1984 | Misumi et al. | 252/501.1 |
| 4,499,331 | 2/1985 | Hamakawa et al. | 252/501.1 |
| 4,546,008 | 10/1985 | Saitoh et al. | 427/38 |
| 4,547,448 | 10/1985 | Shirai et al. | 430/57 |
| 4,555,464 | 11/1985 | Kido et al. | 252/501.1 |
| 4,632,894 | 12/1986 | Ohashi et al. | 252/501.1 |
| 4,645,684 | 2/1987 | Osada et al. | 427/38 |
| 4,661,427 | 4/1987 | Kangi | 430/57 |
| 4,666,808 | 5/1987 | Kawamura et al. | 430/65 |
| 4,668,365 | 5/1987 | Foster et al. | 428/698 |
| 4,721,631 | 1/1988 | Endo et al. | 427/255.2 |
| 4,777,090 | 10/1988 | Oushinsky et al. | 428/336 |
| 4,841,328 | 6/1989 | Takeuchi et al. | 430/58 |
| 4,847,157 | 7/1989 | Goodman et al., | 428/704 |

FOREIGN PATENT DOCUMENTS

| | | |
|---|---|---|
| 0110258 | 6/1984 | European Pat. Off. . |
| 0230788 | 8/1987 | European Pat. Off. . |
| 0289402 | 11/1988 | European Pat. Off. . |
| 2071673 | 9/1981 | United Kingdom . |

OTHER PUBLICATIONS

J. Electrochem Soc., 128, 1555–1563 (Jul. 1981)–Dun et al., "Mechanisms of Plasma-Enhanced Silicon Nitride Desposition Using SiH4/N Mixture".

Primary Examiner—Ellis P. Robinson
Assistant Examiner—Archene A. Turner
Attorney, Agent, or Firm—Young & Thompson

[57] ABSTRACT

The present invention relates to a multilayer protective coating for a substrate and a process for protecting a substrate by the deposition of a continuous, transparent, amorphous, inorganic coating essentially comprising silicon, carbon, nitrogen, oxygen and hydrogen by means of a plasma. The invention also concerns the application of the coatings according to the invention in the protection of substrates and in particular against electrostatic charges.

8 Claims, 1 Drawing Sheet

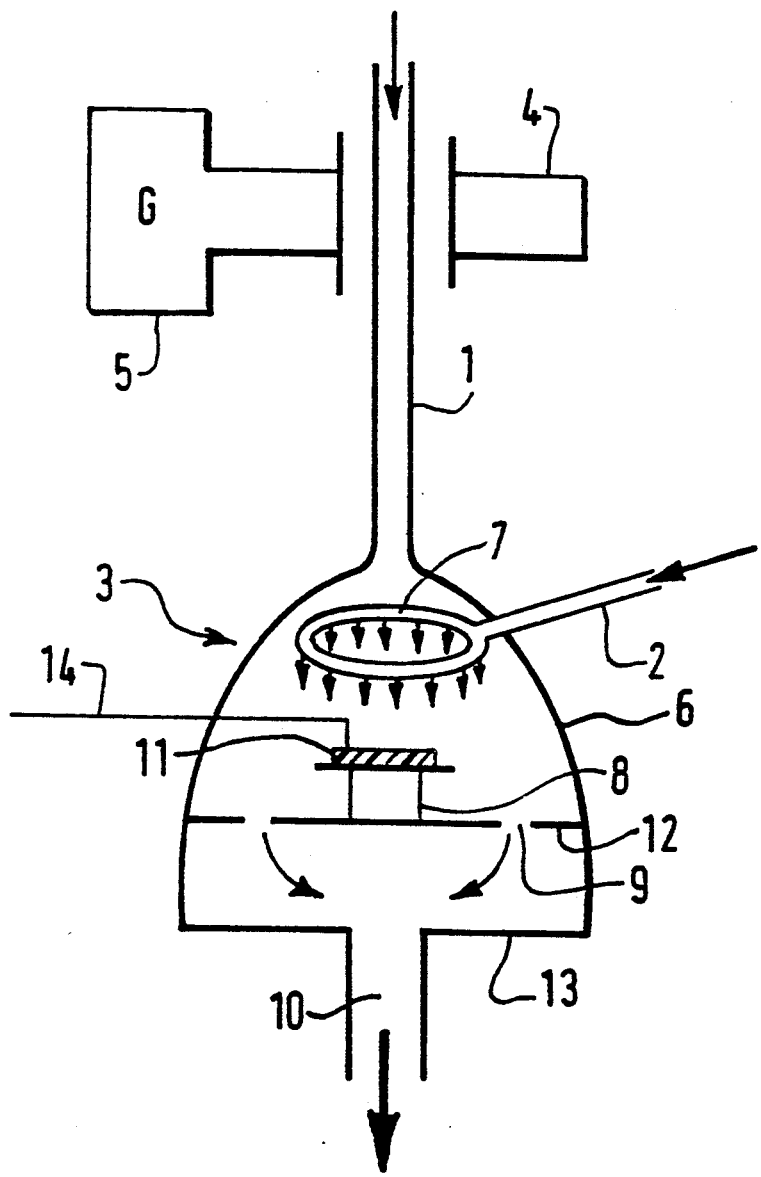

MULTILAYER PROTECTIVE COATING FOR A SUBSTRATE, PROCESS FOR PROTECTING A SUBSTRATE BY A PLASMA DEPOSITION OF SUCH A COATING, COATINGS OBTAINED AND APPLICATIONS THEREOF

The present invention relates to a multilayer protective coating for a substrate.

In the micro-electronic field, it is known to deposit by means of silanes, amorphous compounds of silicon on crystalline silicon within a plasma at temperatures higher than 200° C.

In the automobile industry, it is of particular interest to be able to replace glass, in particular for the glasses of the optical equipment of headlights by lighter polymeric compounds which are more adapted to the elongated and rounded shapes of automobile accessories. However, these polymeric compounds must be protected against chemical and mechanical attack by means of a transparent coating having suitable mechanical and thermal resistance. Patent application WO 85/04601 discloses the production of such a coating in two steps, i.e. a coating of the substrate to be protected by dipping in a silicon resin, then a hot polymerization of the coating.

For the manufacture of a data support for electronics and data processing, for example magnetic supports, it is advantageous to provide the support with an essentially resistant and antistatic coating.

The applicant has shown that it is possible to produce such transparent, hard, coatings which resist thermal variations and humidity and are antistatic.

The present invention therefore relates to a protective multilayer coating for a substrate essentially comprising silicon, carbon, nitrogen, oxygen and hydrogen, constituted by at least two layers, the first layer deposited on the substrate having the formula: Si $C_x N_y O_z H_t$ in which $x=0-0.5$; $y=0-0.15$; $z=0.4-1$ and $t=0.6-1.2$; and in particular $z=0.6-0.8$.

The first layer guarantees the properties of adhesion and resistance to thermal shocks and humidity of the coating on the substrate.

In order to obtain antistatic, adherence, hardness properties and resistances to thermal cycles, a second layer is carried by the first layer and constituted by a deposit having the formula Si $C_{x'}$, $N_{y'}$, $O_{z'}$, $H_{t'}$, where $x'=0-5$; $y'=0.3-0.8$; $z'=1.3-2.5$ and $t'=0.5-1.2$ and in particular the layers in which $x'=0.3-1$; $y'=0.5-0.8$; $z'=1.3-2$ and $t=0.6-1$ are of particular interest.

These coatings are obtained by a plasma deposition process which comprises at least the following steps:

subjecting the substrate to a pre-treatment by a microwave plasma;

exposing the surface of the pre-treated substrate to a microwave plasma in the presence of a gaseous precursor of silicon for depositing a first layer, and subjecting the substrate provided with the first layer to a microwave plasma in the presence of gaseous precursors of silicon and nitrogen in the plasma or in a post-discharge for depositing a second layer.

The gas within which the plasma is created is a conventional plasma-producing gas such as for example the rare gases of the air, for example argon or helium, or neon, or hydrogen and mixtures thereof.

However, it is also possible according to the invention to create the plasma with the precursor gas, for example with nitrogen, ammonia or oxygen.

A precursor gas of an element is intended to mean according to the invention a gas comprising this element and capable of liberating it within the plasma. The various elements liberated by the various precursors recombine to form the inorganic deposit. The elements then come from supplementary sources.

The precursor gas of oxygen and/or nitrogen may be chosen in particular from among $O_2$, $N_2O$, $N_2$ and $NH_3$ and the precursor of carbon, from methane, ethane or $CO_2$. The precursor may be employed as a plasma-producing gas and consequently in some cases the use of a conventional plasma-producing gas in unnecessary.

The precursors of silicon may be the "silanes", i.e. in addition to the silane $SiH_4$, the polysilanes such as $Si_2H_6$ and $Si_3H_8$, the halogenosilanes of formula Si $X_n H_{4-n}$ in which $X=Cl$, F and n is less than or equal to 4 and the organosilanes, for example $SiCl_3CH_3$ or triethylisilane.

But for producing a coating according to the invention, the supply of gaseous precursor element may be in part of another type, since the precursor elements may come from the substrate itself. Indeed, the polymeric substrates may themselves generate under the effect of the plasma certain constituent elements of the coating. A substrate provided with the first layer may also generate certain constituent elements of the coating. It is only necessary to introduce in a gaseous form the required complement for obtaining layers of the coating according to the invention by means of the supplementary sources.

The applicant has shown that the precursor or precursors may be injected as a post-discharge, i.e. the precursor or precursors are injected at the downstream end of the visible zone of the plasma jet, or in the plasma.

It is of utility, before carrying out the deposition, to prepare the surface of the substrate by effecting a pre-treatment under a plasma, this pretreatment cleans the surface of the substrate and promotes the adhesion of the deposit. In particular, pre-treatments with oxygen and ammonia have been found to be effective in promoting the adhesion of the coating.

A post-treatment with plasma may be advantageous for the quality and the adherence of the deposit and the same is true of a thermal post-treatment.

The process empoying a microwave plasma according to the invention is carried out at low pressure, i.e. preferably at less than 10 torr, and for example at a pressure on the order of less than 0.5 torr (1 torr=$1.33 \times 10^2$ Pa). This pressure is adapted in accordance with the employed device for producing the plasma.

The temperatures on the surface of the substrate when carrying out the process according to the invention, i.e. with a low pressure microwave plasma, are of the order of less than 100° C. and in particular lower than the temperatures of the deterioration of the surface to be treated, in particular lower than the temperature of the vitreous transition of the substrate when the latter is polymeric; the advantage of this is that it is possible to treat the polymeric materials with no cooling means during the carrying out of the process.

This low temperature process guarantees in particular the subsequent properties of the protected substrates.

The films deposited are inorganic and amorphous polymers. They are transparent and macroscopically continuous and have a thickness on the order of 1/10 of a micrometer to a few micrometers. The applicant has shown that the first layer has, in order to guarantee the qualities of adhesion of the coating, advantageously a thickness between 1 and 30 nm, in particular between 5 and 20 nm.

The coatings adhere to the substrate (adhesive paper test) and resist abrasion. The following examples describe the temperature variations and the various thermal cycles that the protective coatings of the substrates are capable of supporting.

The applicant has shown that the presence of carbon in the coating results in a good resistance of the latter to thermal variations. When the supply of carbon is from an supplementary source, for example $CH_4$, the ratio Si/C coming from this supplementary source is preferably higher than or equal to 1.

The films have furthermore properties of wettability with respect to water generally higher than those of the substrate.

Apart from these properties, the applicant has shown that the coatings according to the invention have antistatic properties. This property is of interest as concerns applications in micro-electronics in which the presence of electrostatic charges is particularly harmful: plate support, printed circuit and card support, and in general any magnetic data storage means.

The coatings according to the invention may also impart to the surface of the protected substrate properties of hardness which are higher than those of the substrate.

By their hardness, they have certain advantages over the organic deposits used heretofore for the protection of a data support such as laser discs, magnetic tapes and other magnetic supports.

As they are transparent, these deposits may be employed for the protection of the surface of any transparent part which is particularly sensitive to dust and elements retained on the surface by electrostatic charges.

The applications are not intended to be limited to merely objects of plastics materials: a surface of a glass object covered with such a deposit also becomes antistatic.

The process for producing coated articles according to the invention ensures a good quality of the connection between the surface and the film in normal or aggressive conditions: adherence, resistance to chemical baths etc. Owing to the optical, mechanical and chemical properties of the deposited coating (adherence, hardness, resistance to abrasion, chemical resistance etc), the latter constitutes an effective protection of the supports in the event of mechanical or chemical attack and in particular as concerns the maintenance of the optical qualities (high transmission and low diffusion).

The polymeric substrates to be protected according to the invention are chosen in particular from among the moulded or formed transparent polymeric materials used in particular as a glass in the optical systems of vehicle headlights. It may concern materials of the polycarbonate type in particular, polymethylmethacrylate, acrylonitrile polystyrene or crystalline polystyrene.

The polycarbonates are polymers, for example of the poly-(oxycarbonyloxy-1,4-phenylene isopropylidene-1,4-phenylene) type or copolymers based on bisphenol A and a comonomer.

Other substrates may however be protected by an antistatic hard coating according to the invention. There may be in particular mentioned the polyamides, PVC, polyesters such as polyethyleneterephthalate; polyimides, but also polycarbonate covered with aluminium and the silicon substrates.

Such coatings may also be of utility on glass.

The transparent materials may be used for glazing and screens, i.e., apart from headlight glasses or lenses, in particular for the visors of motorcycle helmets, cowlings for motorcycles, fixed or movable lateral glass panes or openable roofs of vehicles and aircraft portholes, town and household lighting optical systems, safety glasses, screens and protections for indicating apparatus and panels, glass houses, verandas and roofs of plastics and watch or spectacle glasses which may be organic or otherwise, given by way of non-limitative examples.

The invention may however also be applied to the protection of nontransparent materials owing to the fact that the coatings have in particular antistatic properties.

This is why the present invention also relates to the application of the coatings according to the invention in the protection of substrates against electrostatic charges.

The process for producing articles according to the invention may be carried out with a device such as that shown in the single FIGURE.

The FIGURE represents a diagrammatic sectional view of an embodiment of a device for carrying out the aforementioned process. The sealed enclosure 3 is constituted by a bell 6 bearing on a circular base 13. A first injection duct 1 (duct 1), having the same axis as the bell 6 is connected to at least one source of gas (not shown). This injection duct 1 passes through a waveguide 4 connected to a microwave generator 5. A second duct 2 (duct 2) connected to at least one source of gas (not shown) passes through the wall of the bell 6 in a sealed manner and is provided at its end inside the bell 6 with a distributor 7 of the gaseous flow which is of toric shape and provided with evenly spaced apart orifices.

The substrate 11 is placed on a support 8; the support 8 comprises a support plate 12 provided with symmetrically arranged oricies 9. The circular base 13 of the bell 6 has an orifice 10 for discharging the effluents and has the same axis as the bell and is connected with a sealed joint to means for creating a depression in the enclosure (not shown). It may for example concern a vacuum pump. A thermocouple 14 measures the temperature on the surface of the specimen 11 and extends through the bell with a sealed joint.

The structure described hereinbefore permits carrying out the process in the following manner:

As will be understood in the examples, a plasma-producing gas enters by way of the duct 1 which receives the microwave energy from the UHF generator G through the waveguide 4. Precursor gases may also be injected through this duct 1. The duct 2 and its distributor 7 permit injecting the precursor gas of silicon, and possibly helium or argon.

However, the duct 2 may also permit the injection of plasma-producing gas when the duct 1 only receives a precursor gas. Preferably, the precuror of silicon is injected in a post-discharge through the duct 2.

The axial arrangement of the injection duct 1 and the distributor 7 of the injection duct 2 are means for achieving a homogeneous injection of the gases. Likewise, the orifice 10 which is also axial and the orifices 9 of the plate 12 arranged symmetrically contribute to the homogeneity of the discharge of the gases. The homogeneous flow of the gases controls the homogeneity of the deposit on the substrate 11 placed at the center of the created flows.

Other variants (not shown), for example in which the symmetry is not cylindrical, or in which the injection ducts are multiplied, may also be envisaged. Their arrangement must take into account the shape, the size and the number of sustrates to be treated in order to obtain a homogeneity of the gas flows which determines the homogeneity of the deposit.

The means creating a depression (not shown) outside the device at the end of the orifice 10 permit regulating the pressure as a function of the gas flows.

A better understanding of the invention will be had from the following examples.

EXAMPLE 1

A deposit is created according to the process on a 5×2 cm. piece of polycarbonate in accordance with the following sequence:

1) pre-treatment with plasma Ar then plasma Ar containing 10% of $NH_3$.

2) deposition with a plasma for 1 minute of a layer of composition $SiC_{0.5}N_{0.15}O_{0.8}H$ from the following gaseous phase:

$SiH_4 = 0.7\%$; $He = 22.6\%$; $Ar = 76.7\%$. (pressure $0.15 \times 10^2$ Pa, G generator with microwave plasma = 2.45 GHz; P = 60 W)

3) deposition by means of a plasma for 1 hour of a layer having a thickness of 1.5 $\mu$m and a composition $SiC_{0.5}N_{0.8}O_2H$ from a gaseous phase of composition $SiH_4 = 0.6\%$; $Ar = 69\%$; $He = 20.4\%$; $N_2 = 10\%$. (pressure $0.5 \times 10^2$ Pa; G generator with a microwave plasma = 2.45 GHz; P = 60 W).

The polycarbonate covered with the deposit is then placed in a thermal enclosure maintained at +25° C. and the thermal cycle such as that defined hereinbefore is carried out:

16 hr at +25° C.
drop from +25° C. to −25° C. at 0.6° C./min.
1 hr at −25° C.
heating from −25° C. to +80° C. at 1°/min.
1 hr at +80° C.
return to +25° C.

The specimen undergoes no alteration.

This same speciment is therefore introduced in a thermal enclosure containing 100% relative humidity (100% RH).

The following thermal cycle is therefore carried out.
16 hr at +25° C.
drop from +25° C. to −25° C. at 0.6° C./min.
1 hr at −25° C.
heating from −25° C. to +80° C./min.
1 hr at +80° C.
return to +25° C.

After two thermal cycles, the specimen is withdrawn and
examined: no visible alteration is seen.

EXAMPLE 2

The speciment of polycarbonate is replaced by a specimen of KAPTON polyimide (Dupont de Nemours) having a thickness of 125 $\mu$m. A deposition such as that described in example 1 is effected.

The speciment is subjected without any alteration to 10 thermal cycles and more than 5 thermal cycles at 100% RH.

Furthermore, the substrate having a thickness of 125 $\mu$m covered with the deposit retains all its flexibility and may be deformed with no cracking and no alteration appearing on the deposit.

EXAMPLE 3

A deposition is effected in accordance with the process on a 5×2 cm. specimen of polycarbonate according to the following sequence:

1) pre-treatment with plasma Ar then plasma Ar containing 10% $NH_3$.

2) deposition with a plasma during 1 minute from the following gaseous phase:

$Si_2H_6 = 0.35\%$; $He = 22.95\%$ and $Ar = 76.7\%$. (microwave plasma generator G at 2.45 GHz power: 60 W; pressure: $0.17 \times 10^2$ Pa).

3) deposition with a plasma for 1 hr of a layer having a thickness of 1.25 $\mu$m from the following gaseous phase:

$Si_2H_6 = 0.3\%$; $H = 20.7\%$ $N_2 = 10\%$; $Ar = 69\%$. (microwave plasma generator G at 2.45 GHz, power: 60–70 W. pressure: $0.35 \times 10^2$ Pa)

The deposit obtained is transparent and perfectly adherent to the polycarbonate.

We claim:

1. A coated body comprising a polymeric substrate having a surface coated with at least two silicon-based transparent layers each formed of a deposited material consisting essentially of silicon, carbon, nitrogen, oxygen and hydrogen, a first of said layers, deposited on the substrate surface being formed of a material having the formula $SiC_xN_yO_zH_t$, in which x does not exceed 0.5; y does not exceed 0.15; z is 0.6–0.8 and t is 0.6–1.2, wherein a second said layer, deposited on said first layer, is formed of a material having the formula $SiC_{x'}C_{x'}N_{y'}O_{z'}H_{t'}$, in which x' does not exceed 0.5; y' is 0.3–0.8; z' is 1.3–2.5 and t' is 0.5–1.2, and wherein the thickness of the first layer is between 1 and 30 nm and the thicknes of the second layer is 1.25–1.5 $\mu$m.

2. A body according to claim 1, wherein x' is 0.3–1; y' is 0.5–0.8; z' is 1.3–2; t' is 0.6–1.

3. A body according to claim 1, wherein the thickness of the first layer is between 5 and 20 nm.

4. A body according to claim 1, wherein said polymeric substrate is transparent.

5. A body according to claim 4, wherein said polymeric substrate is a polycarbonate.

6. A body according to claim 1, wherein the first and second layers are each plasma deposited from precursor gases.

7. A coated body comprising a transparent polymeric substrate having a surface and at least first and second layers of silicon-based amorphous polymer superimposed on the surface, the first layer being deposited on said surface and having a thickness not exceeding 0.030 $\mu$m, the second layer being deposited on the first layer and having a thickness greater than 1 $\mu$m, wherein the first layer is formed of a material having the formula $SiC_xN_yO_zH_t$, in which x does not exceed 0.5; y does not exceed 0.15; z is comprised between 0.4–1 and t is comprised between 0.6–1.2, and the second layer is formed of a material having the formula $SiC_{x'}N_{y'}O_{z'}H_{t'}$, in which x' does not exceed 0.5; y' is comprised between 0.3–0.8; z' is comprised between 1.3–2.5 and t' is comprised between 0.5–1.2.

8. The body of claim 7, wherein the transparent polymeric substrate is selected from the group consisting of polycarbonate, acrylonitrile polystyrene, crystalline polystyrene, polyimide, polyamide and polyester.

* * * * *